United States Patent
Lee et al.

(10) Patent No.: US 6,268,269 B1
(45) Date of Patent: Jul. 31, 2001

(54) METHOD FOR FABRICATING AN OXIDE LAYER ON SILICON WITH CARBON IONS INTRODUCED AT THE SILICON/OXIDE INTERFACE IN ORDER TO REDUCE HOT CARRIER EFFECTS

(75) Inventors: Ming-Tsan Lee, Tainan; Chuan H. Liu, Taipei; Kuan-Yu Fu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/474,846

(22) Filed: Dec. 30, 1999

(51) Int. Cl.[7] .......................... H01L 21/322; H01L 21/336
(52) U.S. Cl. ..................... 438/473; 438/471; 438/476; 438/197; 438/308; 438/770
(58) Field of Search ...................................... 438/257, 308, 438/471, 473, 476, 769, 770, 773

(56) References Cited

U.S. PATENT DOCUMENTS

| | | | |
|---|---|---|---|
| H569 | * | 1/1989 | Varkar et al. . |
| 3,849,204 | * | 11/1974 | Fowler . |
| 4,992,840 | * | 2/1991 | Haddad et al. . |
| 5,453,385 | * | 9/1995 | Shinji . |
| 5,538,923 | * | 7/1996 | Gardner et al. . |
| 5,693,578 | * | 12/1997 | Nakanishi et al. . |
| 5,750,435 | * | 5/1998 | Pan . |
| 5,920,782 | * | 7/1999 | Shih et al. . |
| 5,972,804 | * | 10/1999 | Tobin et al. . |
| 6,143,632 | * | 11/2000 | Ishida et al. . |

* cited by examiner

*Primary Examiner*—Charles Bowers
*Assistant Examiner*—Stephen W. Smoot

(57) ABSTRACT

A fabrication method for an oxide layer with reduced interface-trapped charges, which is applicable to the fabrication of a gate oxide layer of a flash memory device, is described. The method includes conducting a first inert ambient annealing process, followed by growing an oxide layer on the silicon substrate. A second inert ambient annealing process is then conducted on the oxide layer. Carbon ions are then incorporated into the interface between the oxide layer and the silicon substrate, followed by a third ambient annealing process.

22 Claims, 1 Drawing Sheet

METHOD FOR FABRICATING AN OXIDE LAYER ON SILICON WITH CARBON IONS INTRODUCED AT THE SILICON/OXIDE INTERFACE IN ORDER TO REDUCE HOT CARRIER EFFECTS

BACKGROUND OF THE INVENTION

1. Field of the Invention

The present invention relates to a fabrication method for an oxide layer. More particularly, the present invention relates to a fabrication method for a gate oxide layer wherein the hot carrier effect is mitigated and the interface trap charges are reduced.

2. Description of the Related Art

The formation of a silicon dioxide ($SiO_2$) layer on a silicon surface is introduced at different states of an integrated process technology for the various purposes. One such function of these layers is to provide high-quality dielectrics such as a gate oxide layer in the metal oxide semiconductor (MOS) devices.

The layer of silicon dioxide on a silicon semiconductor substrate can either be formed by the dry oxidation method in which sufficiently dried high purity gaseous oxygen is supplied to a heated silicon semiconductor substrate. Wet oxidation can also be carried out conveniently by the pyrogenic technique in which hydrogen and oxygen combine exothermically in the presence of a flame to form a pure water vapor and oxygen ambient. The pyrogenic technique assures a high-purity steam, provided high purity gases are used. Comparing to the oxide layer formed by dry oxidation, a silicon dioxide layer prepared by pyrogenic oxidation is superior in dielectric breakdown properties and long-term reliability. The oxide layer formed by pyrogenic oxidation, however, is inferior in resistance against the hot carrier effect due to the electron-trapped charges attributed to the presence of water. As the device dimensions are further reduced in deep sub-micron manufacturing, the hot carrier effect will become more prominent.

These electron-trapped charges are thought to result from several sources, including structural defects resulting from the oxidation process, metallic impurities or the bond-breaking process. The trapped charges in the gate oxide layer raises the threshold voltage of the device and causes a long-term device degradation. Subjecting the silicon dioxide layer already formed on a silicon surface to a heat treatment in a nitrogen atmosphere has been shown to decrease the fixed charges at the interface and to reduce the energy state at the interface. Introducing nitrogen neutralizes the dangling bonds at the $SiO_2$/Si interface.

With respect to a flash memory device, electrons are injected or discharged through a floating gate to write or erase data. During such operations, the control gate, the source and the drain are held at appropriate voltages to generate hot electrons. Once these electrons gain sufficient energy and overcome the potential barrier of the gate oxide layer, they travel from the substrate and inject into the floating gate. The injection of the hot electrons, however, easily ruptures the N—H bonds and the Si—H bonds at the $SiO_2$/Si interface, resulting in an increase of the interface-trapped charges and interface energy state. If trapped charges are present in the gate oxide layer of flash memories, the threshold voltage of the transistors constituting the flash memory would fluctuates, leading to a malfunction of the flash memory.

SUMMARY OF THE INVENTION

Based on the foregoing, a fabrication method for an oxide layer is provided, wherein a succession of annealing processes is conducted to improve the quality of the oxide layer. A low concentration of carbon ions is also incorporated at the $SiO_2$/Si interface to suppress the bond breaking process due to hot electron injection. The formation of interface-trapped charges and the resulting hot carrier effects are thus mitigated.

This fabrication method for an oxide layer of a semiconductor device according to the preferred embodiment of the present invention includes conducting a first inert ambient annealing on the silicon surface. Pyrogenic wet oxidation or the traditional dry oxidation is then conducted to grow a layer of the silicon dioxide on the silicon surface. A second inert ambient annealing is further conducted, followed by incorporating carbon ions into the interface between the silicon substrate and the oxide layer. A third annealing process is further conducted in an inert gas atmosphere to terminate the dangling bonds at the $SiO_2$/Si interface by forming the C—H and Si—C bonds.

According to this version of the present invention, a succession of the annealing processes is performed to improve the oxide layer properties by reducing contamination and interface-trapped charge density. Carbon ions are also incorporated to eliminate the dangling bonds at the interface between the silicon oxide and silicon substrate. Since C—H and Si—C bonds are network formers instead of network modifiers, they are more resistant to be ruptured by the injected hot electrons, the formation of interface-trapped charges and the resulting hot carrier effects are thus minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 1A to 1D are schematic, cross-sectional views showing the fabrication method for an oxide layer according to the present invention.

Figure 1A:
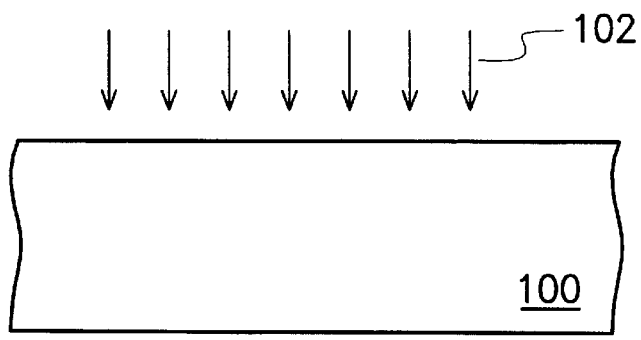
FIGS. 1A to 1D are schematic, cross-sectional views showing the fabrication of an oxide layer according to the preferred embodiment of the present invention.

Referring to FIG. 1A, a silicon substrate 100 is provided. A pre-oxidation cleaning process is conducted to remove both organic and inorganic contaminants arising from previous process steps and handling. An inert ambient annealing 102 is then conducted on the silicon substrate 100 to remove the native oxide from the surface and to enhance the quality of the subsequently formed oxide layer. The inert ambient annealing 102 is conducted at a temperature in a range of about 800 degrees Celsius to 900 degrees Celsius for a duration of about 30 minutes. The inert gas used for the anneal treatment 102 includes argon.

Figure 1B:
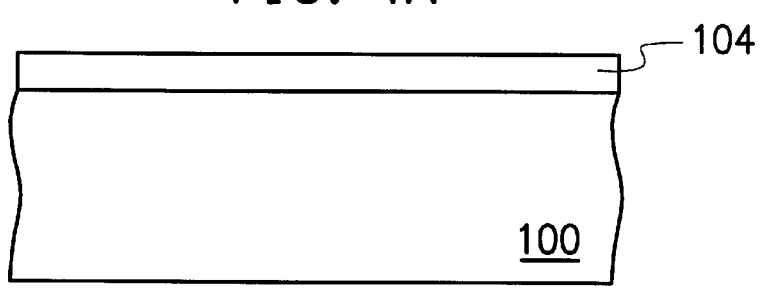

Thereafter, pyrogenic wet oxidation or the traditional dry oxidation is conducted to grow a layer of silicon dioxide 104 on the silicon substrate 100 as shown in FIG. 1B. The pyrogenic wet oxidation is executed by, for example, maintaining the substrate 100 at a temperature of about 700 degrees Celsius to 800 degrees Celsius to allow hydrogen and oxygen to combine exothermically to form water vapor and an oxygen ambient. For dry oxidation, oxygen, mixed with an inert carrier gas such as nitrogen, is passed over the substrate 100 at the elevated temperature of about 500 degrees Celsius to about 1150 degrees Celsius.

Figure 1C:
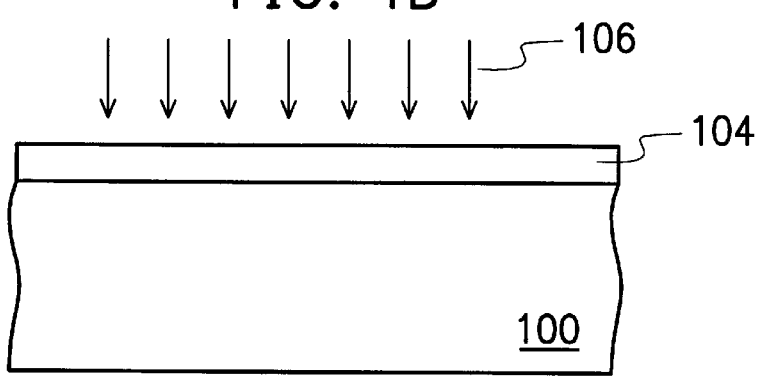

Referring to FIG. 1C, the silicon dioxide layer 104 is further heat treated by conducting an annealing process 106. The annealing process 106 is conducted at about 800 degrees Celsius to about 900 degrees Celsius for about 30 minutes in an inert gas atmosphere such as an argon gas atmosphere. The inert ambient annealing neutralizes the interface-trapped charges.

Figure 1D:
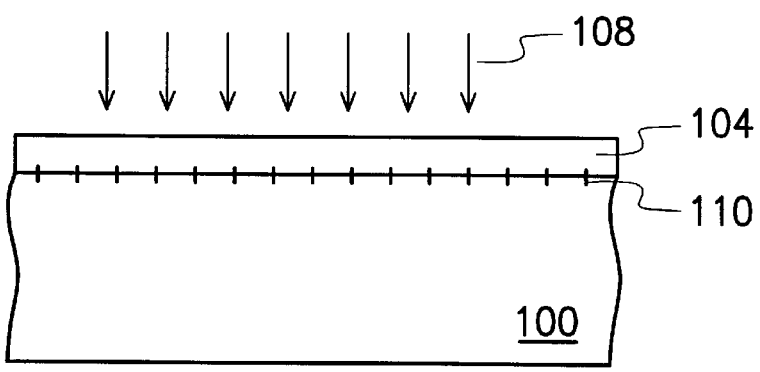

Continuing to FIG. 1D, a low concentration of carbon ions is incorporated by, for example, implantation or diffusion, into the interface between the silicon substrate 100 and the silicon dioxide layer 104. The dosage for the implanted carbon ions is, for example, about $2 \times 10^{15}$ cm$^{-2}$ and the energy for implantation is about 60 KeV. An inert ambient annealing process 108 is further conducted for the implanted carbon ions to react with and to fill the dangling bonds at the interface by forming the C—H and Si—C bonds 110. The inert ambient annealing process 108 is also conducted at a temperature of about 800 degrees Celsius to about 900 degrees Celsius for about 30 minutes. The inert gas used in this process includes argon gas.

According to the preferred embodiment of the present invention, a series of the inert ambient annealing is conducted to neutralize the interface-trapped charges at the interface between the oxide layer and the underlying silicon substrate and to improve the quality of the oxide layer. Carbon ions are also incorporated at the interface between the oxide layer and the silicon substrate to terminate the dangling bonds of silicon and oxygen at the interface. As a result, the interface-trapped charges are reduced and the hot carrier effects are thus minimized. In the case of a flash memory device, the C—H and the Si—C bonds formed at the interface between the gate oxide layer, formed according to the preferred embodiment of the present invention, and the silicon substrate are thus more resistant to be ruptured by the injected hot electrons during the programming and erasure operations because of their higher bonding strengths. The presence of trapped charges in the gate oxide layer, leading to a malfunction of the flash memory device is thereby mitigated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for an oxide layer of a semiconductor device, the method comprising the steps of:
   providing a silicon substrate;
   performing a first annealing process on the silicon substrate;
   growing an oxide layer on the silicon substrate;
   conducting a second annealing process on the oxide layer;
   incorporating carbon ions into an interface between the oxide layer and the silicon substrate; and
   conducting a third annealing process on the oxide layer.

2. The fabrication method for an oxide layer of a semiconductor device according to claim 1, wherein the step of the first annealing process is conducted in an inert gas ambient.

3. The fabrication method for an oxide layer of a semiconductor device according to claim 2, wherein the inert gas ambient includes an argon gas atmosphere.

4. The fabrication method for an oxide layer of a semiconductor device according to claim 1, wherein the step of the first annealing process is conducted at a temperature of about 800 degrees Celsius to about 900 degrees Celsius for about 30 minutes.

5. The fabrication method for an oxide layer of a semiconductor device according to claim 1, wherein the step of growing the oxide layer includes conducting thermal oxidation.

6. The fabrication method for an oxide layer of a semiconductor device according to claim 5, wherein the thermal oxidation process includes a pyrogenic wet oxidation process.

7. The fabrication method for an oxide layer of a semiconductor device according to claim 5, wherein the thermal oxidation process includes a dry oxidation process.

8. The fabrication method for an oxide layer of a semiconductor device according to claim 1, wherein the step of the second annealing process is conducted in an inert gas ambient.

9. The fabrication method for an oxide layer of a semiconductor device according to claim 8, wherein the inert gas ambient includes an argon gas atmosphere.

10. The fabrication method for an oxide layer of a semiconductor device according to claim 1, wherein the second annealing process is conducted at a temperature of about 800 degrees Celsius to about 900 degrees Celsius for about 30 minutes.

11. The fabrication method for an oxide layer of a semiconductor device according to claim 1, wherein the step of incorporating carbon ions includes performing implantation.

12. The fabrication method for an oxide layer of a semiconductor device according to claim 11, wherein a dosage of the implanted carbons is about $2 \times 10^{15}$ cm$^{-2}$.

13. The fabrication method for an oxide layer of a semiconductor device according to claim 11, wherein an energy for the step of implantation is about 60 KeV.

14. The fabrication method for an oxide layer of a semiconductor device according to claim 1, wherein the step of incorporating carbon ions includes a diffusion process.

15. The fabrication method for an oxide layer of a semiconductor device according to claim 1, wherein the step of the third annealing process is conducted in an inert gas ambient.

16. The fabrication method for an oxide layer of a semiconductor device according to claim 15, wherein the inert gas ambient includes an argon gas atmosphere.

17. The fabrication method for an oxide layer of a semiconductor device according to claim 1, wherein the third annealing process is conducted at a temperature of about 800 degrees Celsius to about 900 degrees Celsius for about 30 minutes.

18. A fabrication method for a gate oxide layer of a flash memory device, wherein the interface-trapped charges are reduced, the method comprising the steps of:
   providing a silicon substrate;
   conducting a first inert ambient annealing on the silicon substrate;
   performing thermal oxidation on the silicon substrate to grow an oxide layer on the silicon substrate;
   conducting a second inert ambient annealing on the oxide layer;

implanting carbon ions into an interface between the oxide layer and the silicon substrate; and conducting a third inert ambient annealing on the oxide layer.

19. The fabrication method for a gate oxide layer of a flash memory device according to claim 18, wherein the first, the second and the third inert ambient annealings are conducted at a temperature of about 800 degrees Celsius to about 900 degrees Celsius for 30 minutes.

20. The fabrication method for a gate oxide layer of a flash memory device according to claim 18, wherein the first, the second and the third inert ambient annealings are conducted in an argon gas atmosphere.

21. The fabrication method for a gate oxide layer of a flash memory device according to claim 18, wherein a dosage of the implanted carbon ions is about $2 \times 10^{15}$ cm$^{-2}$.

22. The fabrication method for a gate oxide layer of a flash memory device according to claim 18, wherein the carbon ions are implanted at an energy of about 60 KeV.

* * * * *